United States Patent [19]
Marrian et al.

[11] Patent Number: 5,825,040
[45] Date of Patent: Oct. 20, 1998

[54] BRIGHT BEAM METHOD FOR SUPER-RESOLUTION IN E-BEAM LITHOGRAPHY

[75] Inventors: Christie R. K. Marrian, Marbury; Martin C. Peckerar, Silver Spring, both of Md.

[73] Assignee: The United States of America as represented by the Secretary of the Navy, Washington, D.C.

[21] Appl. No.: 774,063

[22] Filed: Dec. 23, 1996

[51] Int. Cl.⁶ .................................................. H01J 37/302
[52] U.S. Cl. ........................... 250/492.22; 250/398
[58] Field of Search ............... 250/492.22, 398, 250/492.23; 430/296, 30

[56] References Cited

U.S. PATENT DOCUMENTS

| | | | |
|---|---|---|---|
| 4,426,584 | 1/1984 | Bohlen et al. | 250/492.2 |
| 4,463,265 | 7/1984 | Owen et al. | 250/492.2 |
| 4,504,558 | 3/1985 | Bohlen et al. | 430/30 |
| 4,520,269 | 5/1985 | Jones et al. | 250/492.2 |
| 4,812,962 | 3/1989 | Witt et al. | 364/490 |
| 5,082,762 | 1/1992 | Takahashi et al. | 430/296 |
| 5,241,185 | 8/1993 | Meiri et al. | 250/492.2 |
| 5,254,438 | 10/1993 | Owen et al. | 430/296 |
| 5,334,282 | 8/1994 | Nakayama et al. | 156/643 |
| 5,703,376 | 12/1997 | Jensen | 250/492.22 |

*Primary Examiner*—Kiet T. Nguyen
*Attorney, Agent, or Firm*—Thomas McDonnell; John Karasek

[57] ABSTRACT

A method and apparatus for bonding a layer of coating material onto a substrate with minimal bulk heating of the substrate. A pulsed electron beam generator is used to produce high energy electrons at the beginning of the pulse and a larger number of lower energy electrons at the end of the pulse. A thin sacrificial or ablative layer of an easily-vaporized material such as tin is placed on top the coating. The high energy electrons penetrate through the ablative and coating layers. The ablative layer is heated to a molten state, causing it to vaporize. The ablation process generates a force on the coating layer which drives it into the substrate.

9 Claims, 5 Drawing Sheets

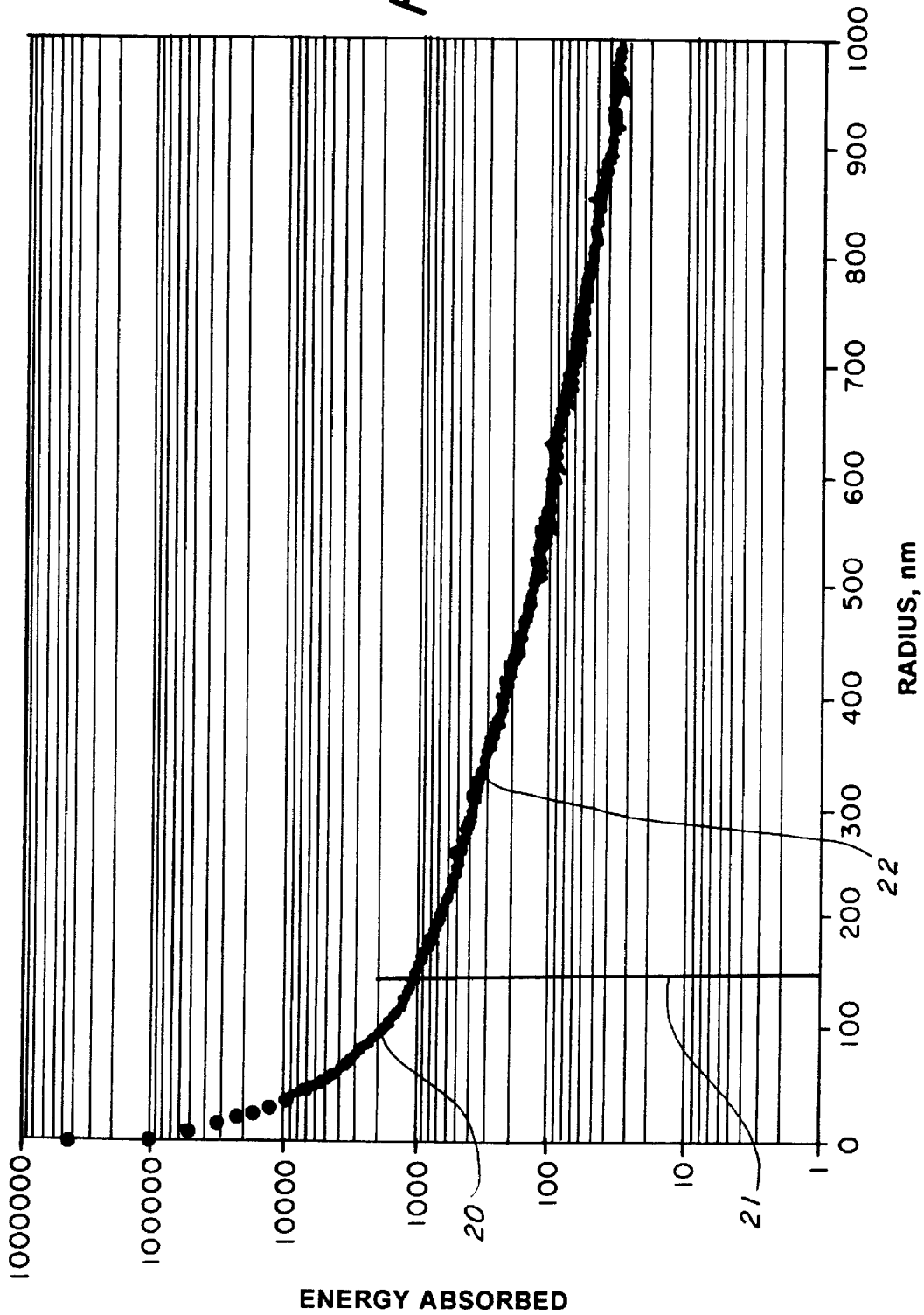

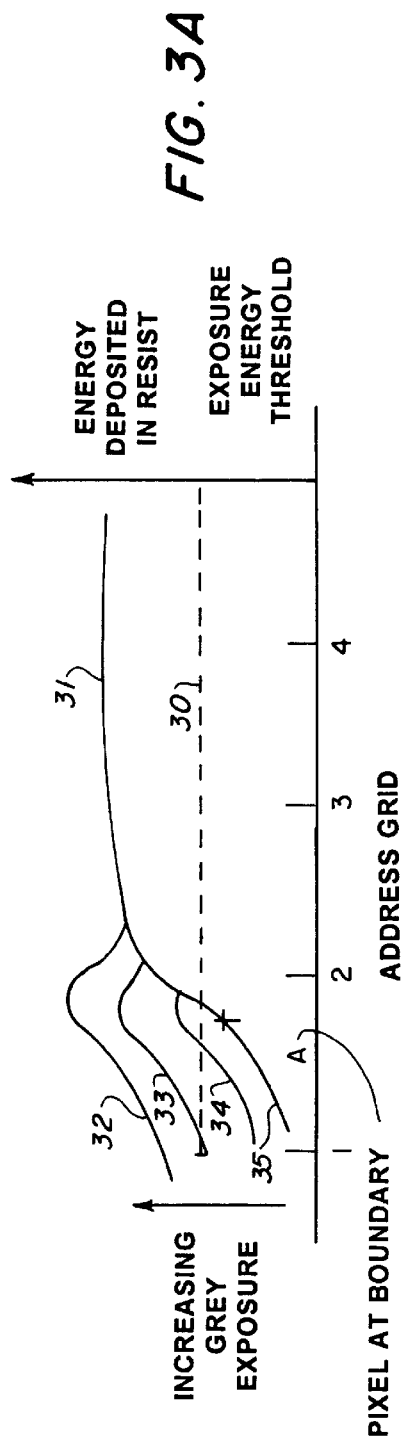
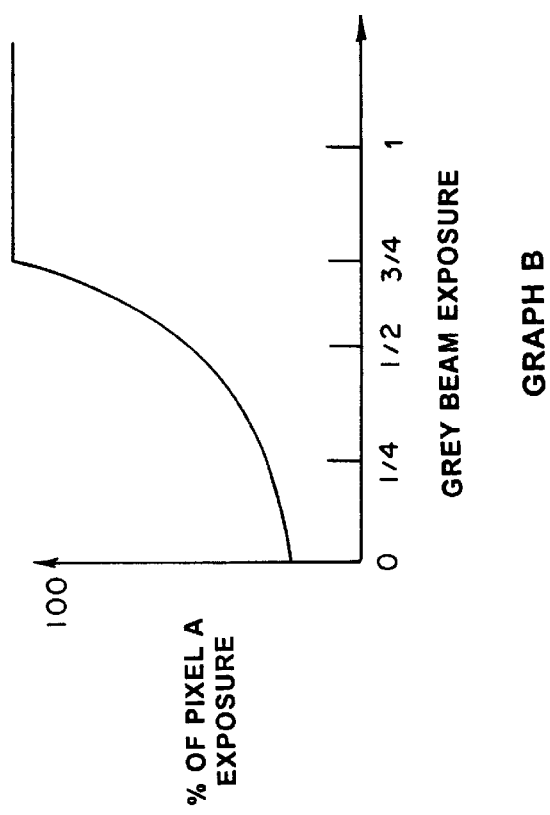
FIG. 3A
FIG. 3B

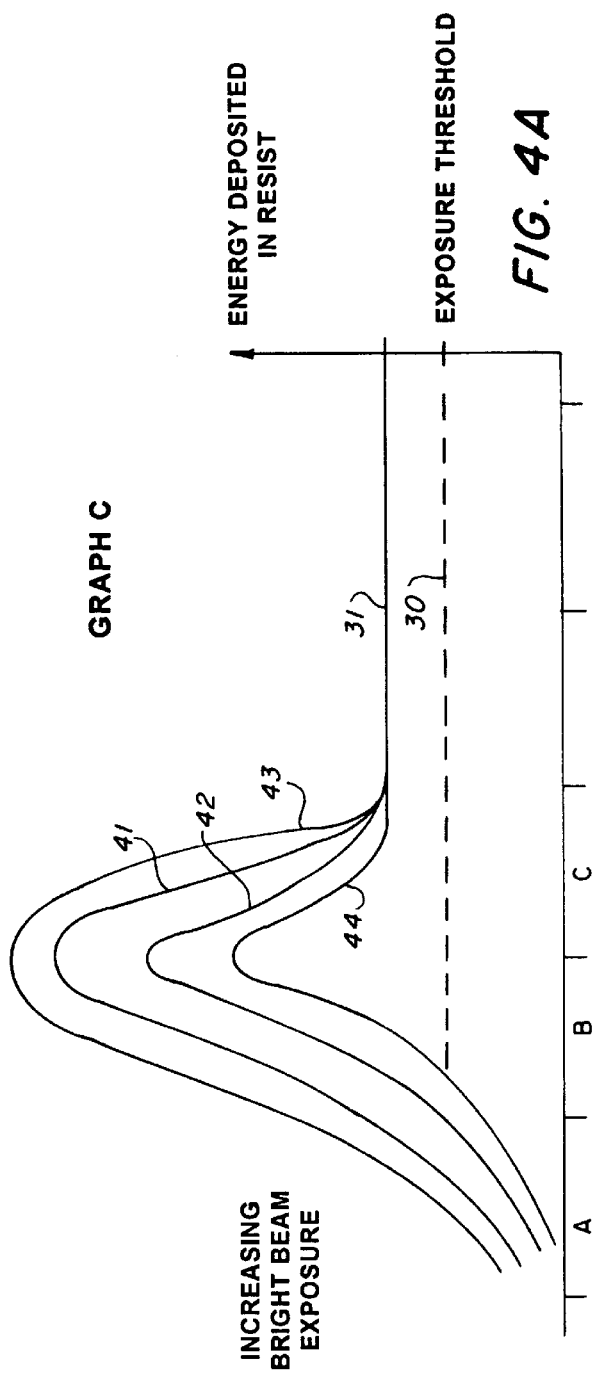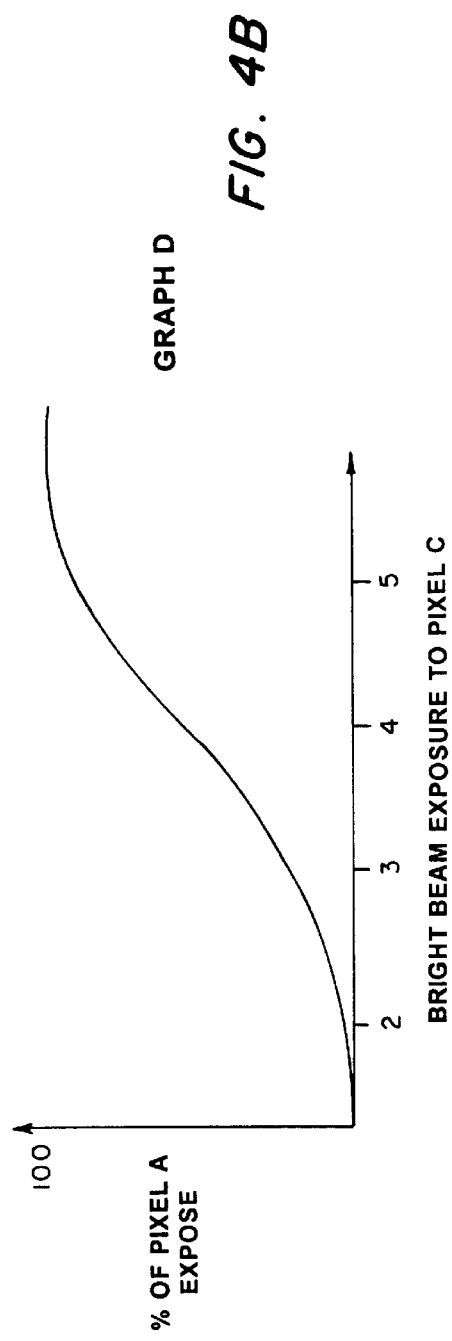

BRIGHT BEAM METHOD FOR SUPER-RESOLUTION IN E-BEAM LITHOGRAPHY

BACKGROUND OF THE INVENTION

The present invention generally relates to the field of e-beam lithography, and more particularly, is directed to a method of resolution enhancement in a beam lithography system without the need to decrease the address grid used by the exposure system. Thus, the invention provides a more accurate feature boundary placement without the decrease in throughput associated with decreasing the size of the address grid. Further, the method of the invention is significantly less demanding on the lithography system's performance and provides higher process latitude than existing techniques.

In e-beam lithography, a steered beam lithography system creates a pattern in a radiation sensitive imaging layer (called a resist) by moving the beam between pixels mapped out on a Cartesian address grid. The beam can be a focused or shaped beam of electrons, photons or ions. The vast majority of steered beam lithography tools use a focused beam of electrons for the lithography.

The minimum feature size possible with a lithography tool is related to the size of the focused beam and the address grid. Conventional wisdom states that the address grid and the spot size should be about one fifth of the minimum feature size required in the lithographic pattern. Successive generations of microelectronics circuits require increasingly smaller minimum feature sizes. For example, current manufacturing technology is using 500 nm minimum features. Every three years or so the minimum feature size decreases by approximately 30% with 180 nm minimum feature sizes being projected for use at the beginning of the next century.

In an e-beam lithography tool, the challenges of decreasing feature sizes are met by decreasing the feature size and the size of the address grid. However, decreasing the feature size, increases the total number of pixels per unit area. As each pixel (or group of pixels) is serially exposed by the electron beam, exposure results in the time required to expose a given area of pattern increasing in lock step with the number of pixels.

In the past, this challenge has been met by increasing the speed (i.e., decreasing the time the e-beam tool requires to expose an individual pixel) of the tool. For example, current generation e-beam tools operate at 160 MHZ meaning they can expose a pixel every 6ns. However, increasing the speed above this rate is expensive in terms of tool development and the point at which it is no longer cost effective is rapidly being reached. As a result, there is considerable interest in developing alternate techniques to increase the accuracy with which a feature boundary can be placed to decrease the minimum feature size possible with an e-beam tool without decreasing the address grid size and its corresponding increase in exposure time.

Increased accuracy of feature boundary placement is made more difficult by the scattering of the electrons in the resist and substrate during the lithography process. Note that when an electron passes through a resist material it can undergo scattering events which result in the creation of a secondary electron and/or a change of direction of the incident electron. As a result, energy is deposited in the resist material at a location away from the point of incidence of the primary beam. In addition, electrons are scattered in the substrate material under the resist layer and can be scattered back into the resist, again causing energy to be deposited in the resist remotely from the point of incidence of the primary beam.

The above described scattering process is illustrated in FIG. 1 which is a Monte Carlo simulation of e-beam lithography. As shown in FIG. 1, incident primary electrons, illustrated by line 1, pass through resist layer 2 into substrate 3. As the electrons enter the resist and substrate, they began to scatter, with some electrons, indicated by line 4, being projected back into resist layer 2 at locations remote from their initial entry point and other electrons, indicated by line 5, propagating completely through substrate 3. Resist 2 also is subject to bombardment from stray fast secondary electrons 6 emanating from other sites of back scattered electrons.

The scattering process illustrated in FIG. 1 can be modeled as illustrated in FIG. 2. Here, the point spread function for a 20 kV beam of electrons incident on 500 nm of resist on tungsten is shown in FIG. 2. FIG. 2 demonstrates that a significant part of the energy deposited by the electron beam ends up at locations remote from the point of incidence of the primary beam. (In practice the point spread function would be further smeared out by the size of the beam itself).

It has been found that the point spread function has two main components. The first component 20 is apparent at dimensions <150 nm as represented by line 21 in FIG. 2. The function is approximately gaussian in shape with a full width at half maximum (FWHM) of about 150 nm. Component 20 results from scattering of the beam on its initial pass through the resist (forward scattering).

The second component 22 is the broad tail, again roughly gaussian in form with a FWHM of about 500 nm extending out beyond the limits of the data displayed in FIG. 2, i.e. 150 to >1000 nm. This type of scattering is referred to as "back scattering" as illustrated in FIG. 1. Note from FIG. 2 that the slope of the function is steep in the forward scattering region.

The phenomenon of energy "leakage" due to electron scattering gives rise to so-called proximity effects. The correction of these effects is a major problem facing e-beam lithography. It should be noted, that a similar "leakage" of exposure between pixels occurs for all types of lithography.

A number of methods and procedures are known in the prior art for mitigating leakage or proximity effect. Several such methods are described in U.S. Pat. Nos. 4,426,584 and 4,504,558, both of which issued in the name of Bohlen et al. As described by '584 patent, one such method "subject[s] the areas of the pattern to electron beams of differing intensity, and determines the respective dosage in such a manner that scattering electrons of other adjacent pattern elements are taken into consideration" Col. 1, lines 52–56. As the Bohlen patents explains, the disadvantage of such a method includes the need for extensive arithmetic operations in order to determine the proper irradiation dosage.

Another method for correcting proximity effect disclosed by the Bohlen patents involves exposing the pattern elements in larger than their normal dimensions, then promoting shrinkage of the pattern elements back to normal size during the development process. This method is difficult to implement in practice with intricate pattern elements.

In the Bohlen invention, proximity effect is compensated for by exposing selected pattern elements through multiple masks. Needless-to-say, the requirement of multiple masks makes this method more time consuming and expensive to practice.

Other prior art approaches to correcting or compensating for proximity effects include U.S. Pat. No. 4,463,265 issued in the name of Ownens et. al., wherein the exposed surface of the resist material is subdivided into non-overlapping pixels with a first set of pixels representing a selected pattern for e-beam lithography and a second set including all other pixels. The cumulative exposure for each pixel in the first set is computed by adding to the direct beam exposure of that pixel, the contributions of spill-over (back-scattering) exposure arising from exposure of nearby pixels in the second set.

U.S. Pat. No. 4,520,269 issued in the name of Jones involves the breaking of each shape of a lithographic exposure pattern into a perimeter part and a remaining central part. The pattern is then modified by moving or setting back the edges of each central part away from the perimeter part which surrounds it to form a nominally unexposed band separating each central part from the perimeter part surrounding it.

U.S. Pat. No. 5,082,762 issued in the name of Takahashi discloses a method for selectively exposing a resist layer, wherein a pattern within a first predetermined region is exposed by a main exposure, and a second pre-determined region is exposed by auxiliary exposure at an intensity level lower than that of the main exposure.

U.S. Pat. No. 5,254,438 issued in the name of Owens et al. discloses a technique for electron beam proximity effect correction by reverse field pattern exposure, wherein the region of the resist complementary to the desired circuit pattern is also exposed by an electron beam which has been adjusted to produce an exposure approximating that due to back-scattering.

While the prior art appreciates the need for better definition and resolution for increasingly smaller and smaller feature sizes in e-beam lithography, none of the prior art approaches fully and adequately address the problem.

SUMMARY OF THE INVENTION

For the above reasons, there is a need in the prior art for an improved e-beam lithography method which permits a decrease in feature size without compromising resolution and definition and without a corresponding decrease in throughput or loss of resolution.

Accordingly, it is the overall object of the present invention to provide an improved method of e-beam lithography which overcomes the above noted disadvantages of such methods known in the prior art.

It is a specific object of the present invention to provide an improved method of e-beam lithography which is more efficient and lower in cost than such methods known in the prior art.

It is a still further specific object of the present invention to provide an improved method of e-beam lithography which can be used with many different types of photo resists than such methods known in the prior art.

It is a still further object of the present invention to provide an improved method of e-beam lithography which can be used in much higher volume applications than such methods known in the prior art.

These and other objects of the present invention are achieved by controlling the position of a feature boundary by optimizing the strategy used to expose the resist at points away from the pixel at the feature edge. The exposure "leaks" into the region where the feature boundary is to be placed due to electron scattering.

BRIEF DESCRIPTION OF THE DRAWINGS

The present invention will now be described with reference to the drawings in which:

FIG. 2 is a graph which models the scattering effects illustrated in FIG. 1 by charting distance vs energy absorbed;

FIG. 3 is a schematic representation of gray beam exposure of a pixel at the edge of a feature;

FIG. 4 is a schematic representation of bright beam exposure of a pixel at the edge of a feature in accordance with the present invention.

DETAILED DESCRIPTION OF THE PREFERRED EMBODIMENT

The position of a feature in e-beam lithography is determined by the position on a feature where the energy deposited locally in the resist layer drops below a critical exposure energy density level. When the resist is subsequently developed, the resist with less than this exposure energy will be washed away in the case of a negative tone resist. The position at which this energy is reached is designed to be aligned with the address grid by appropriately exposing the pattern.

The position of the edge of the feature can be controlled with a finer resolution by controlling the exposure in the pixel at the edge of the feature. Controlling the exposure in this way is illustrated schematically in FIG. 3 and is the basis of the so-called Gray Beam approach to "super resolution" (i.e., sub address grid size pattern placement).

The lower line of Graph A of FIG. 3 represents a partial view of an address grid showing lines 1, 2, 3, 4, etc. Corresponding orthogonal lines which intersect respective lines 1–4 are present but are not shown in the view illustrated by Graph A. The space between each of lines 1–4 represents a pixel. Pixel "A" between lines 1 and 2 corresponds to the edge of a feature to be exposed. Dashed line 30 represents the exposure energy threshold level for the resist and solid line 31 represents the energy level of the electrons deposited in the resist. As the left hand side of Graph A illustrates with respect to lines 32–35, the energy level of the electrons is gradually increased for pixel "A" in accordance with the Gray Beam approach to "super resolution." The gradual increase of the energy level of pixel "A" also is plotted in Graph B of FIG. 3 as percentage of pixel exposure versus the position of the beam with respect to the pixel.

FIG. 4 illustrates a bright beam approach to "super resolution" in accordance with the present invention. In this approach, the feature boundary is controlled by over exposing the pixel one back from the boundary rather than under exposing the pixel at the boundary as discussed above with respect to the Gray Beam approach.

Graph C in FIG. 4 illustrates a plurality of pixels "A"–"C" between respective grid lines 1–4. Pixel "A" represents the boundary of the feature to be exposed. Note that pixel "B", one pixel back from the edge of the boundary, is over exposed with a high level of energy represented by energy lines 41–44. The major advantage of this approach is that the energy deposited in the resist varies more rapidly with position than in the Gray Beam approach. This leads to a greater process latitude for the bright beam technique and is more robust against variations in processing parameters such as electron beam current, resist sensitivity and resist development conditions, all of which determine the critical exposure energy threshold.

Figure 1:
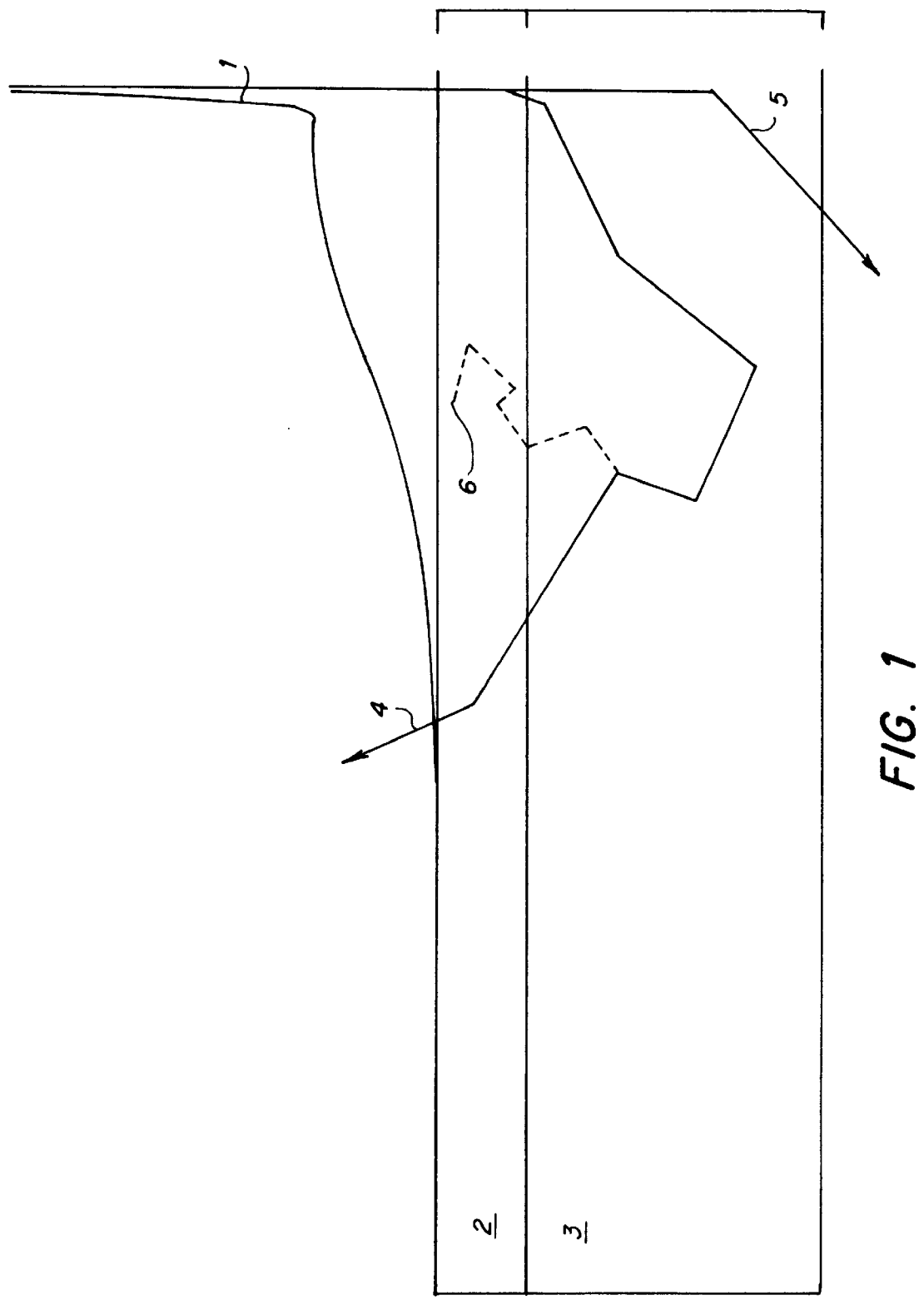
FIG. 1 is a schematic representation of the scattering effects of an electron beam as it passes through a resist and into a substrate.
Figure 5:
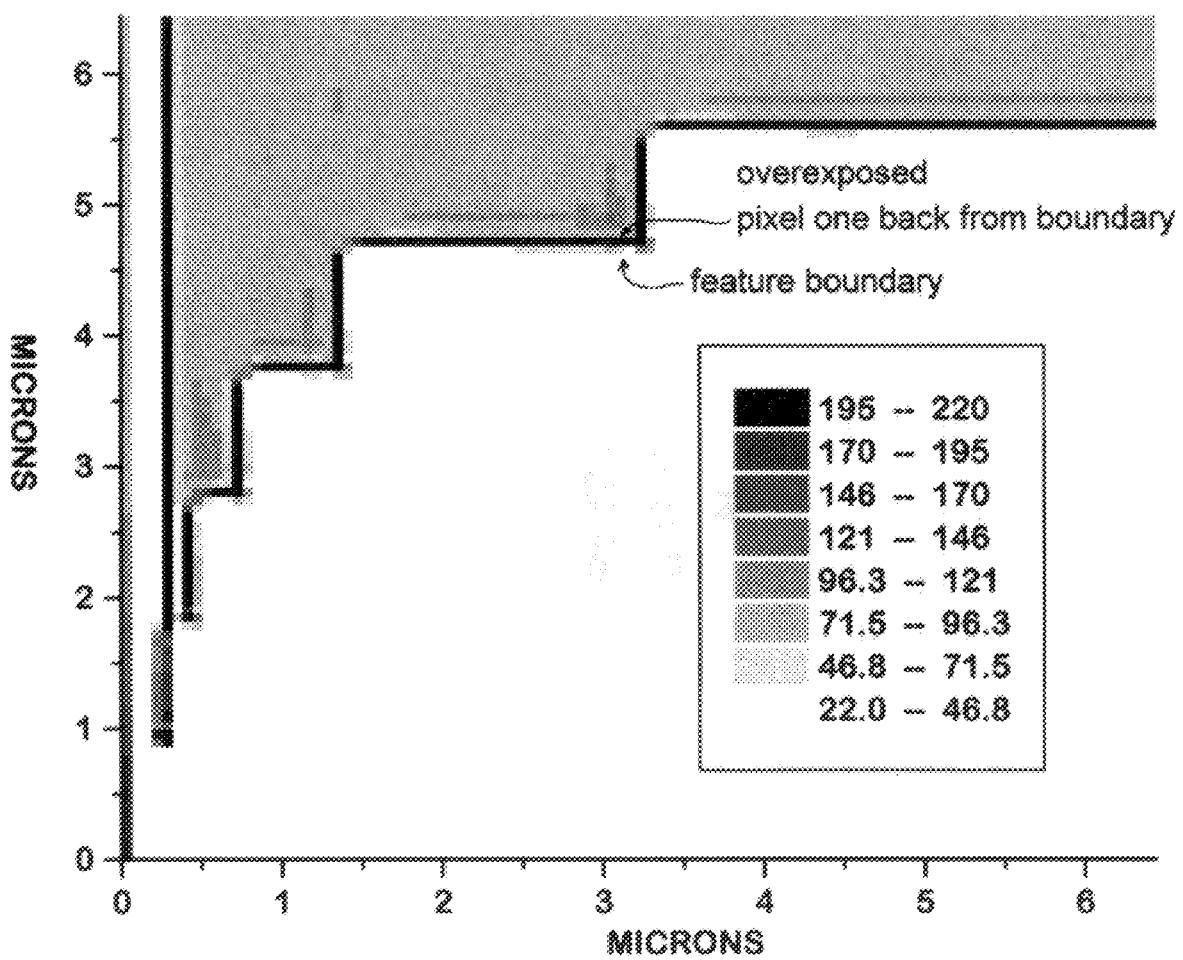
FIG. 5 is a schematic representation of the results of proximity effect correction using a regularized optimization technique in accordance with the present invention.

FIG. 5 illustrates the results of proximity effect correction using a regularized optimization technique. Examining the edge of the "tower" pattern in FIG. 5 shows that the algorithm generating the proximity correction is controlling the position of the feature boundary by the energy that leaks out from the pixel one address grid back from the feature edge rather than exposing the feature at the edge directly. In this way the algorithm corrects for the proximity effects due to the forward scattering part of the point spread function.

A second advantage to the bright beam exposure method of the present invention relates to the tool modification which is necessary for implementation. In the case of Gray Beam, (the under-exposure of the pixel at the feature boundary), the exposure ("flash") time must be less than the normal exposure time. This means that the tool must be capable of turning the beam on and off faster than is done in normal exposure conditions. This requires significant (and costly) upgrades to the drive electronics associated with the beam blanking circuit. In the case of the bright beam, (the over exposure of the pixel back from the feature boundary), a longer flash time than normal exposure is required. This can obviously be achieved without modification of the existing beam blanking electronics.

Many variations and modifications of the above described embodiments of the present invention will become apparent to those of ordinary skill in the art from a reading of this disclosure. It should be realized that the invention is not limited to the particular apparatus disclosed, but its scope is intended to be governed only by the scope of the appended claims.

We claim:

1. A method of using an e-beam to expose a pattern onto an e-beam sensitive resist film, said method having the following steps:
   (a) dividing said pattern into a plurality of pixel elements, wherein a first one of said pixel elements corresponds to a boundary of said pattern and a second one of said pixel elements is located adjacent to said first one of said pixel elements;
   (b) positioning said e-beam at said second pixel element; and
   (c) delivering a selected dose of electron beam radiation to said second pixel element in accordance with a predetermined regiment sufficient to expose said first one of said pixel elements.

2. The method of claim 1, further including the steps of:
   (a) determining the exposure energy threshold for said resist; and
   (b) selecting said dose of electron beam radiation in accordance with said exposure threshold.

3. The method of claim 2, wherein said dose is selected so that said resist will undergo a transition from exposure to less than said energy threshold to exposure to more than said energy threshold.

4. The method of claim 3, wherein said transition occurs at a selected point within said first one of said pixel elements.

5. The method of claim 1, further including the steps of:
   (a) determining the energy absorption profile for said resist for e-beam electrons incident at a point on said resist as a function of the radius from said point; and
   (b) selecting said dose of electron beam radiation in accordance with said energy absorption profile.

6. The method of claim 1, further including the steps of:
   (a) determining the point spread function for said resist for e-beam electrons incident at a point on said resist as a function of the radius from said point; and
   (b) selecting said dose of electron beam radiation in accordance with said point spread function.

7. The method of claim 6, further including the step of:
   (a) determining the amount of energy required to be absorbed by said resist in order to convert said resist into a develop able state and further selecting said dose of electron beam radiation in accordance with said determination.

8. A method of using an e-beam to expose a pattern onto an e-beam sensitive resist film, said method having the following steps:
   (a) dividing said pattern into a plurality of pixel elements, wherein a first one of said pixel elements corresponds to a boundary of said pattern and a second one of said pixel elements is located adjacent to said first one of said pixel elements;
   (b) positioning said e-beam at said second pixel element;
   (c) determining the exposure energy threshold for said resist;
   (d) determining the energy absorption profile for said resist for e-beam electrons incident at a point on said resist as a function of the radius from said point; and
   (e) delivering a selected dose of electron beam radiation to said second pixel element in accordance with said exposure energy threshold and said energy absorption profile so that said resist will undergo a transition from exposure to less than said energy threshold to exposure to more than said energy threshold.

9. The method of claim 8, wherein said transition occurs at a selected point within said first one of said pixel elements.

* * * * *